United States Patent [19]

Kleis et al.

[11] 4,322,579
[45] Mar. 30, 1982

[54] SOUND REPRODUCTION IN A SPACE WITH AN INDEPENDENT SOUND SOURCE

[75] Inventors: Derk Kleis; Johannis A. Van Gorsel, both of Breda, Netherlands

[73] Assignee: U.S. Philips Corporation, New York, N.Y.

[21] Appl. No.: 124,880

[22] Filed: Feb. 26, 1980

[30] Foreign Application Priority Data

Feb. 26, 1979 [NL] Netherlands ................ 7901477

[51] Int. Cl.³ ............................................. H03G 3/32
[52] U.S. Cl. .................................. 179/1 D; 179/1 P; 179/1 VL
[58] Field of Search .................... 179/1 D, 1 P, 1 VL

[56] References Cited

U.S. PATENT DOCUMENTS

| | | | |
|---|---|---|---|
| 2,338,551 | 1/1944 | Stanko | 179/1 P |
| 2,657,264 | 10/1953 | Augustadt | 179/1 P |
| 4,061,874 | 12/1977 | Fricke et al. | 179/1 P |
| 4,061,875 | 12/1977 | Freifeld et al. | 179/1 P |

*Primary Examiner*—James W. Moffitt
*Assistant Examiner*—J. A. Popek
*Attorney, Agent, or Firm*—Robert T. Mayer; Bernard Franzblau

[57] ABSTRACT

Sound reproduction in a noisy environment may be improved by detecting the noise level and deriving a control signal therefrom. The control signal may control the gain and frequency response of the reproduction amplifier by controlling an electronic potentiometer which provides a control function which varies from a signal of high reproduction quality towards a signal which has been subjected to contrast compression and which exhibits a roll-off towards the bass frequencies.

13 Claims, 6 Drawing Figures

SOUND REPRODUCTION IN A SPACE WITH AN INDEPENDENT SOUND SOURCE

BACKGROUND OF THE INVENTION

The invention relates to an arrangement for sound reproduction in a space with an independent sound source, a control voltage which is dependent on the level of said sound source being obtained by means of a sound transducer, which control voltage influences the gain and the frequency response of an amplifier which is included in the sound reproduction channel. This may in particular concern an arrangement in which the independent sound source is constituted by ambient noise, such as for example in a railway station, a football stadium and the like. However, the arrangement in accordance with the invention is also suitable for use in a space, for example a restaurant, where the independent sound source is constituted by the public and/or background music.

Arrangements of the aforementioned type are described in German Offenlegungsschriften Nos. 2,456,445 and 2,456,468, which have been laid open to public inspection, British Pat. No. 596,778 and U.S. Pat. Nos. 4,061,874 and 4,061,875. In the known arrangements described therein the amplifier is set to a higher level as the level of the independent sound source increases, and in particular the frequency response is also modified so that within various frequency intervals the level of the sound produced by the sound reproduction channel always exceeds that of the independent sound source.

SUMMARY OF THE INVENTION

The known arrangements are fairly intricate, and in some cases the power consumption is unnecessarily high. It is an object of the invention to provide a substantial improvement by a combination of steps, some of which are known per se from the literature cited in the foregoing. To this end the invention is characterized in that the sound reproduction channel is divided into at least two branches, one branch of which has a flat frequency response to the transmission of sound, whereas at least one other branch has a transfer characteristic which falls towards the bass frequencies and comprises a dynamic-range compressor. The outputs of the branches are applied to a device for converting the output signals of these branches in a variable proportion into a single signal, which proportion is controlled by said control voltage. Furthermore, means are provided which ensure that the generated control voltage is not, or is hardly influenced, by the signal which passes through the sound reproduction channel.

The invention is based on the following considerations: As long as in the relevant space the level of the independent sound source—for the sake of convenience referred to as noise level, although it applies equally as well to background music—is comparatively low, a second reproduction amplifier of high reproduction quality will be capable of producing enough sound to prevail over the noise level. When the noise level increases the amplifier should also be adjusted to a higher level.

Experiments have revealed that the intelligibility of speech is mainly determined by the frequency content of the speech signal above 1000 Hz, whereas the speech signal power is mainly determined by the frequency content below 1000 Hz. If the noise level increases, the intelligibility of the speech signal can be preserved by amplifying the speech signal above 1000 Hz to a level which exceeds the level of the noise for frequencies above 1000 Hz. The low-frequency content of the speech signal(below 1000 Hz) may be left unchanged or, as the case may be, attenuated, so that this part of the signal disappears in the noise. A similar line of reasoning is valid for the reproduction of speech by means of the arrangement. In this case the boundary frequency between the range which mainly determines the power and the range which mainly determines the intelligibility is approx. 500 Hz.

Thus, in contradistinction to the line of reasoning in some of the references cited, the sound level produced in the arrangement in accordance with the invention is not adapted to the noise level in each of the frequency intervals, but the combination of amplification and compression of the treble tones and attenuation of the bass-signal tones is applied. In this bass range the sound produced, certainly in respect of the softer passages, will therefore generally remain below the noise level, but as appears from experiments, the spurious noise is masked mainly in the treble range, i.e. in the case of speech above approximately 1000 Hz. By the said combination of steps an amplifier of moderate power may therefore suffice because the signal amplitude to be processed increases only slightly by suppression of the bass tones (which generally have the highest amplitude) and also by contrast compression. This suppression of the bass tones, in a further embodiment of the invention, contributes to the fact that the control voltage, which is dependent on the noise level, is substantially independent of the sound produced via the sound reproduction channel. If said control voltage were to increase with the sound produced, this could give rise to instabilities because, in accordance with this sound, the reproduction amplifier would be set to an even higher gain causing the control voltage to increase again etc.

In principle, three possibilities are available for generating such a control voltage, which possibilities may be applied separately or in combination. First of all the electric signal in the reproduction channel may be rectified and subtracted from the voltage produced by the sound transducer so that the resulting differential voltage is virtually a measure solely of the noise level. In practice, this rectified voltage will be applied as a threshold voltage to an amplifier for the voltage produced by the sound transducer so that said amplifier only transmits the voltage which corresponds to the noise level.

Secondly, a memory circuit may be included in the channel of the control voltage. This fixes the control voltage at a value corresponding to the voltage produced by the sound transducer prior to the instant that the signal is produced in the reproduction channel. To this end the electric signal in the reproduction channel is for example detected again and by means of the detected voltage thus obtained the channel between the sound transducer and the memory circuit is interrupted.

Thirdly, a filter may be included in the channel of the sound transducer, which filter only transmits frequencies which are not or hardly transmitted by the reproduction channel. Since, as stated in the foregoing, the transmission of bass tones by the reproduction channel even decreases for an increasing control voltage, the requirements to be imposed on said filter may be alleviated under certain circumstances. Bby extension of this method one or more rejection filters, which are adapted to specific functions, may be included in the reproduction channel and corresponding band-pass filters in the control voltage channel so that the frequencies transmitted in the control voltage channel correspond to the frequencies rejected in the reproduction channel.

The methods described all have their specific advantages and disadvantages, the reproducing arrangement being optimized by a suitable combination thereof.

As an example, the first method cannot readily be used in spaces with strong reverberation because the sound transducer, in addition to an acoustic signal corresponding to the electric signal in the reproduction channel, also picks up one or more reflections of this signal.

The second method is less useful in spaces with a strongly fluctuating noise level because the actual noise level may differ substantially from that at the instant at which the control voltage has been fixed at a fixed value.

Owing to the use of the said rejection filters the third method causes a—be it slightly—unnatural reproduction. However, for the most frequently occurring purposes this method provides the best possibilities and is therefore described extensively hereinafter.

BRIEF DESCRIPTION OF THE DRAWINGS

The invention will be described in more detail with reference to the accompanying drawing, in which.

DETAILED DESCRIPTION OF THE DRAWINGS

Figure 1:
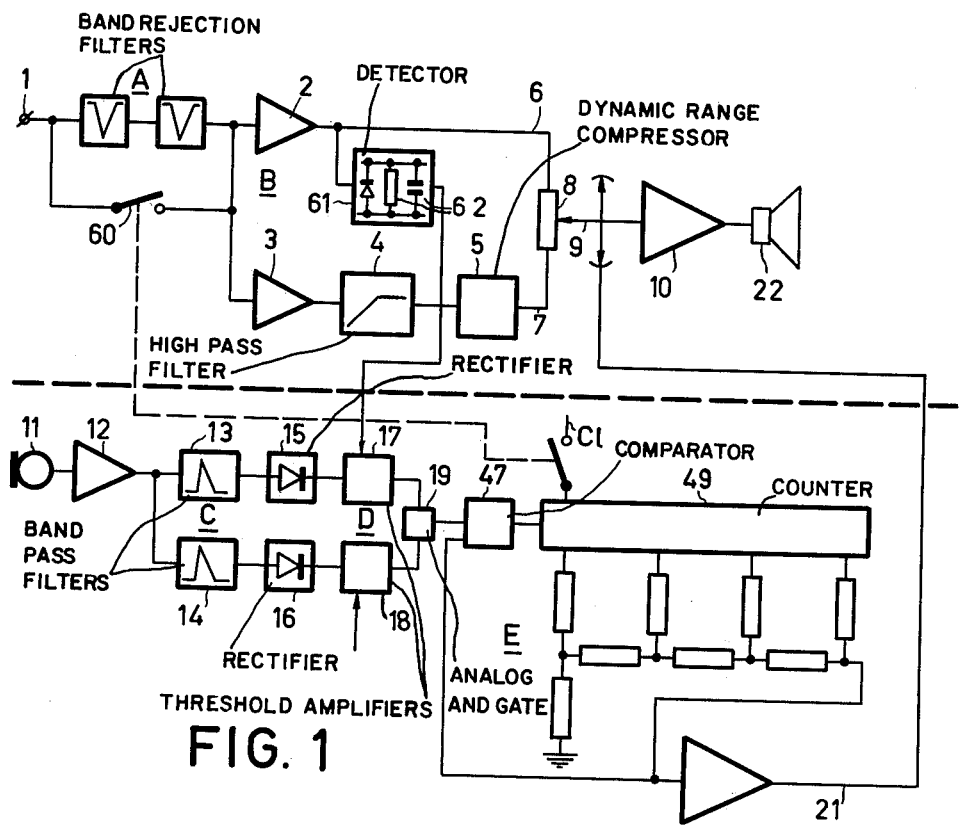
FIG. 1 represents a schematic diagram of an embodiment of the invention.

In the block diagram of FIG. 1 a signal to be reproduced is applied to an input point 1, subsequently passes through a filter circuit A—represented in the diagram as two series connected rejection filters—, after which the signal passes through first and second signal processing circuits formed into two parallel branches B, one branch comprising an amplifier 2 of high reproduction quality, the other branch comprising, in this order, an amplifier 3, a filter 4 which provides an attenuation towards the bass tones, and a dynamic-range compressor 5. The output signals at points 6 and 7 are subsequently combined in a variable proportion, for example, by means of potentiometer 8 having a slider 9 connected to the input of an output amplifier 10 connected in cascade with a sound reproducer (loudspeaker) 22. The dividing ratio—in the diagram the position of the slider 9—is controlled by means of the circuit section shown below the dashed line in FIG. 1. However, it is alternatively possible to include a variable amplifier in each of the channels 6, 7. The two signals may then be combined either electrically, or acoustically by loudspeakers in each branch. The circuit section below the dashed line in FIG. 1 comprises a sound transducer 11—generally a microphone—an amplifier 12, a filter circuit C, which transmits only those frequencies which are rejected by the filter circuit A, in the diagram represented as two parallel filters 13 and 14 that supply output signals which are rectified with the aid of rectifiers 15 and 16 and are subsequently applied to a circuit 19 via a threshold device D, specifically threshold amplifiers 17 and 18. The circuit 19 then transfers the greater of the two signals to a memory device E comprising a comparator 47 and an up/down counter 49. The output of the memory, after amplification, produces a control voltage at point 21. The position of the slider 9 could be controlled electromechanically by means of said control voltage, but in practice the use of an electrically controlled electronic potentiometer 8, 9 is to be preferred.

The operation of the arrangement described in the foregoing is as follows:

The sound transducer 11 is arranged in the space in which sound is to be reproduced so that it picks up sounds from independent sound sources, referred to in the foregoing as "noise" for the sake of convenience, although this may alternatively be background music and the like. Inevitably the sound transducer 11 will also pick up a part of the sound produced by the reproduction channel 1-10. The use of the filter circuits A and C now ensures that the signals transmitted by the filter circuit C correspond practically only to the noise level, whereas the filter circuit A in the reproduction channel 1-10 suppresses signals of the aforesaid noise frequencies.

Thus, in the case of an increasing noise level, signals of increasing strength will be produced at the outputs of the threshold devices 17 and 18, which signals correspond to the noise level in each of the frequency ranges transmitted by the filters 13 and 14 respectively. In its simplest form one filter suffices, for example a filter 13, which transmits a comparatively high frequency, but when it is anticipated that in the relevant space the sound spectrum of the noise produced has a character such that the signal transmitted by said filter 13 is sometimes not a measure of the total noise level, it is desirable to sample said noise by means of the filter 14 also at that (those other) frequency(ies) which determine(s) said level, after which the stronger of the signals passing through the channels 13, 15, 17 and 14, 16, 18 is extracted with the aid of a circuit 19 so as to generate the control voltage at point 21. If the noise also contains low-frequency components, i.e. frequencies below approx. 500 to 1000 Hz, it is very desirable to also sample the noise in this low-frequency range in spite of the fact that the intelligibility of the signal passing through the reproduction channel is mainly determined by the frequency range above said frequencies. The reason for this is that said low-frequency components mask the high-frequency signal components and thereby affect the intelligiblity of speech. The control voltage at point 21 determines the proportion in which the signals at points 6 and 7 respectively reach the output amplifier 10. In the case of a low noise level the output amplifier is connected to point 6 so that a sound reproduction of high quality is obtained via the amplifier 2. However, if the noise level increases, a continually increasing control voltage will be produced at point 21 so that the signal at point 7 reaches the amplifier 10 to an increasing extent. Relative to that at point 6 said signal at point 7 exhibits a number of distinct differences:

First of all the overall level is substantially higher.

Secondly, the treble tones are favoured additionally.

In the third place the bass tones are attenuated substantially.

In the fourth place the overall signal is subjected to dynamic-range compression.

Figure 2:
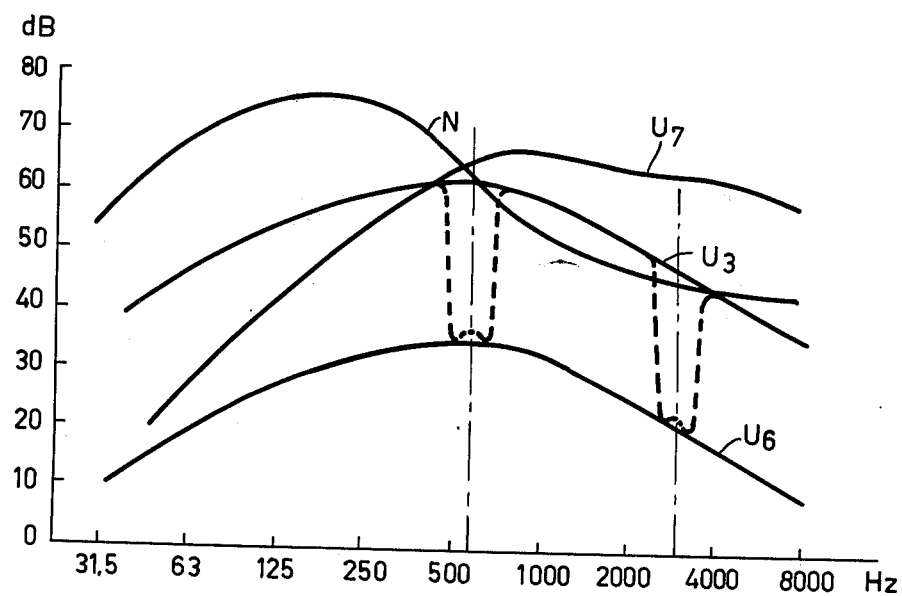
FIG. 2 represents the energy distribution at various points in the diagram of FIG. 1.

FIG. 2 illustrates the level of the signal at point 7 relative to that at point 6. The frequency in Hz is plotted horizontally and the signal energy per third octave is plotted vertically in dB. The curve $U_6$ represents the energy distribution of normal speech signals at point 6. As a result of the dynamic range of the signal the entire curve $U_6$ is also shifted upwards and downwards. The amplifier 3 produces a signal $U_3$, which is some tens of dB's stronger than the signal $U_6$. The filter 4 attenuates the bass tones relative to the treble tones so that the curve $U_7$, which represents the signal at point 7, may be derived from the curve $U_3$ by tilting this last-mentioned curve about a point near approximately 500 Hz (i.e. substantially below the frequency to which the human ear is most sensitive). As a result of this the treble frequencies have been boosted to such an extent that their energy content becomes more significant than that of the bass tones. Therefore, the output amplifier 10 could be driven to an undesirably high value during strong signal passages, but this is prevented by the use of the dynamic-range compressor 5, which limits the dynamic range of the signal $U_7$ to a few dB.

In comparison with the energy distribution N of a spurious sound source, for example ambient noise, a reproduction volume is therefore obtained which in the treble range exceeds the noise level, whereas in the bass range the reproduction volume, at least during the soft passages, may remain substantially below the noise level. Thus, without significantly increasing the drive of the output amplifier 10, the noise is prevented from masking the desired signal, thus guaranteeing a satisfactory intelligibility of the sound to be reproduced.

Various stages of the diagram of FIG. 1 are described in more detail hereinafter.

The rejection filter circuit A takes the form of a ladder network with L-C parallel tuned circuits in the series branch and L-C series tuned circuits in the parallel branches, so that two series connected T-sections are obtained (see FIG. 3), of which the first section rejects a frequency band with a comparatively high centre frequency, for example 3000 Hz and the second section rejects a frequency band with a substantially lower centre frequency, for example 600 Hz. The filter is preceded and followed by operational amplifiers in order to provide correct impedance matching. For the said frequencies those values have been selected which are most characteristic of the noise spectrum to be anticipated. The effect of these filters on the output signal of amplifier 3 is represented by dashed lines in FIG. 2. Under certain circumstances such a low value may be chosen for the said lower frequency that the tilting of the curve $U_7$ relative to the curve $U_3$ additionally contributes to the avoidance of acoustic instabilities.

The filter circuit A should attenuate the signals to such an extent that in the absence of noise the energy level of the signal generated at this cut-off frequency is not yet capable of producing a control voltage via the channel 11-21 (FIG. 1). A signal at the input terminal 1 is attenuated by a certain number of db's in the filter circuit A, subsequently reaches the sound reproducer (loudspeaker) 22 via the amplifiers 2 and 10, is then picked up by the sound transducer 11, is boosted again by a certain number of dB's in the filter circuit C after amplification in the amplifier 12 and is detected in the rectifier stage(s) 15 (16). The signal then produced (assuming that noise is absent) should not exceed the threshold(s) of the stage(s) 17 (and 18 respectively) because in the case of the said assumption no control voltage should be produced at point 21. If the signal through the reproduction channel 1-10 were to cause a control signal, this would result in an increasing amplitude of the signals at loudspeaker 22, which could give rise to instabilities. Neither should there be a control signal during the strongest signal passages, which in practice may exceed the softer passages by some tens of dB's.

Therefore, the minimum requirement to be imposed on the filter circuit A is that during the strongest signal passages it attenuates these signals to a value below the noise level at the relevant cut-off frequency. If the noise level increases, so that the input signal of the amplifier 10 gradually changes from $U_6$ to $U_7$, the signal transmitted by this filter also increases, so that an increased risk of acoustic instability is to be anticipated. However, if said cut-off frequency is selected so low that said increase distinctly lags behind the increase of the noise level—which is certainly so below the intersection of the curves N and $U_7$ in FIG. 2—the control voltage produced is mainly determined by the noise level and the risk of acoustic instabilities is avoided.

Figure 4:
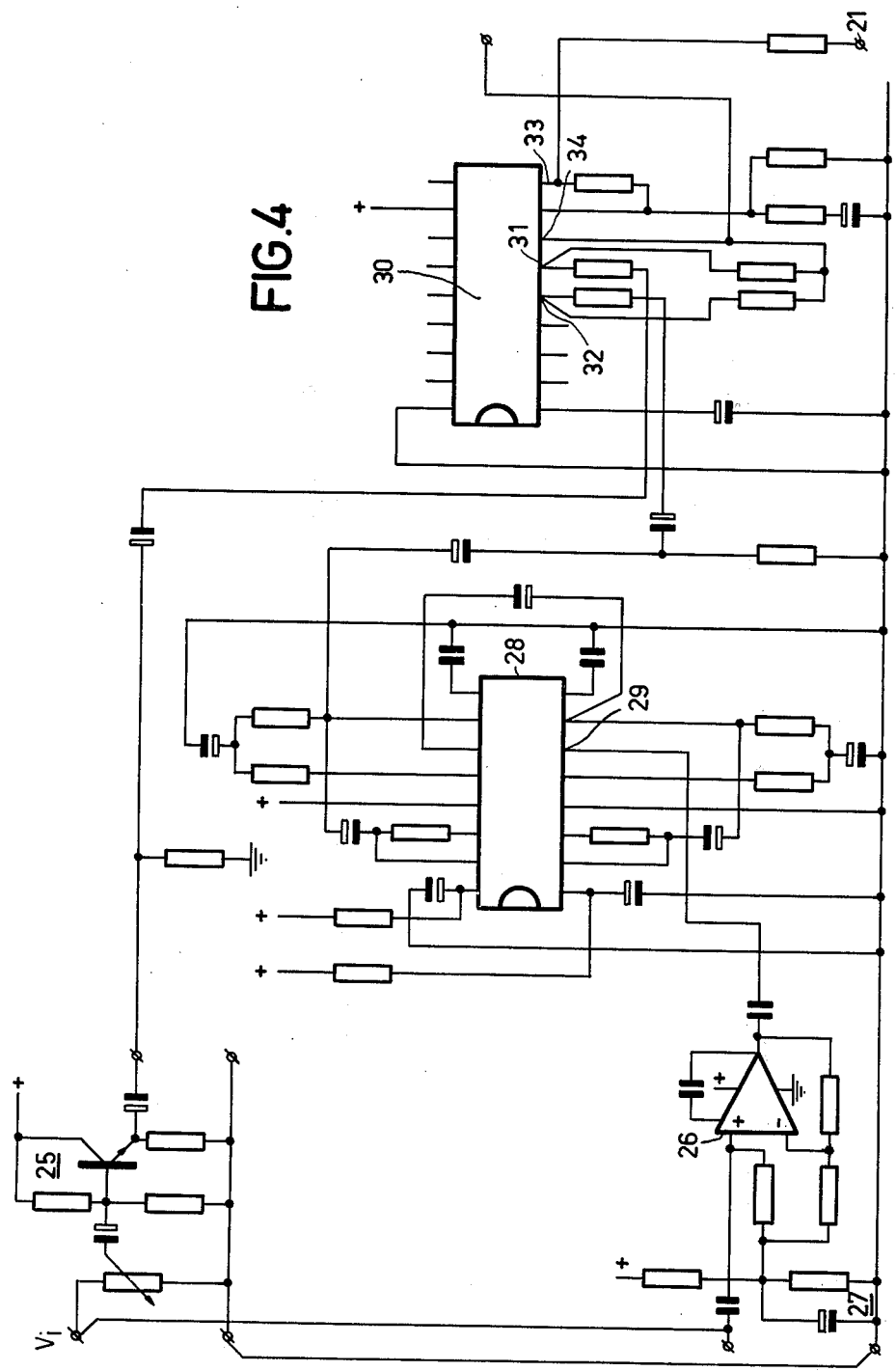
FIG. 4 represents one possible embodiment of a part of the reproduction channel in FIG. 1 and including two branches.

FIG. 4 shows a possible version of first and second signal processing circuits that form the respective parallel branches B of FIG. 1. The signal $V_i$ transmitted by the filter circuit A passes through a low-distortion amplifier 25, corresponding to the amplifier 2 in FIG. 1. The amplifier 3 of FIG. 1 takes the form of an operational amplifier 26, for example of the type TDA 1034 (Philips). The operation of the network 4 is realized by means of a negative feedback circuit 27 in the form of an R-C network, which below approx. 1000 Hz produces an attenuation towards the low frequencies of 6 dB per octave. If it is to be expected that the noise in the space at least substantially has the character of pink noise, i.e. having a substantially flat power spectrum, the network 4 will exhibit a frequency response curve which rises with 6 dB/octave from approx. 1000 Hz towards the higher frequencies, up to for example 8 kHz. The network 4 then produces a change from the curve $U_3$ to the curve $U_7$ in FIG. 2.

However, if it is anticipated that the noise in the space has the character of speech, i.e. approximately having a power spectrum as represented by $U_3$ in FIG. 2, it suffices to use a network 4 having a flat frequency response for frequencies above approx. 1000 Hz. In this frequency range the signal to be reproduced may be raised above the noise level by merely varying the gain and without applying a frequency correction to the frequency response of the signal which passes through channel 7.

Figure 5:
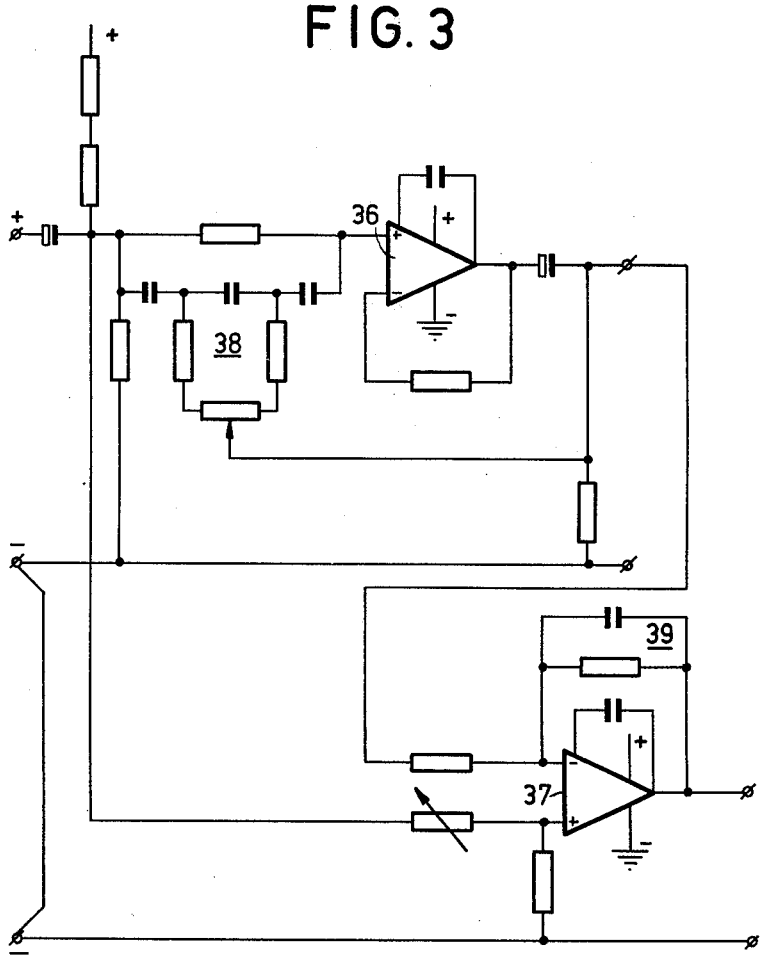
FIG. 5 shows one possible version of a band-pass filter.

The dynamic-range compression is obtained with the aid of the integrated circuit 28 of the type NE 570B (Philips). The signal at the input 29 is full-wave rectified and the control voltage thus obtained controls the signal gain in such a way that the gain decreases at increasing signal amplitude. This type of integrated circuit enables the dynamic range of the signal to be reduced by a factor of 4. The electronic potentiometer or summing circuit 8-9 of FIG. 1 is realised in the form of an integrator circuit 30 of the type TDA 1074 (Philips). The output signal of the amplifier 25 (amplifier 2 in FIG. 1) is applied to the one input 31 of this integrated circuit 30, while the output signal of the compressor 28 (stage 5 in FIG. 1) is applied to a further input 32 of said integrated circuit 30. The control voltage at point 21 of FIG. 1 is applied to connection point 33 of the integrated circuit 30, so that at point 34 of this circuit a voltage is produced whose magnitude depends on the signal voltages at points 31 aand 32 in a proportion which is determined by the control voltage at point 33. A possible version of the filters 13 and 14 in FIG. 1 is shown in FIG. 5. Each filter comprises two parallel-connected branches to the output of an operational amplifier 37 the operational amplifier 36 being included in one branch. The amplifiers 36 and 37 are provided with negative feedback circuits 38 and 39 respectively which exhibit a high selective amplification for only those frequencies for which the corresponding section of the filter circuit A (FIG. 3) exhibits a substantial rejection.

Figure 3:
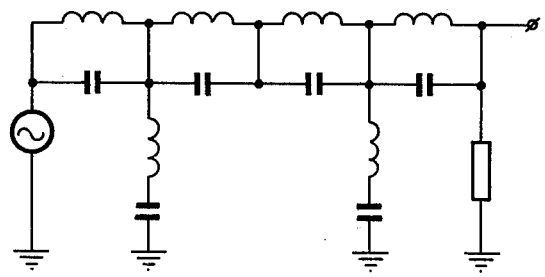
FIG. 3 shows one possible embodiment of the rejection filter in FIG. 1.

As a modification of this version, such a selective amplification can also be obtained with the aid of a differential amplifier, the signal from the sound transducer 11 which has been amplified in amplifier 12 being applied directly to its one input and the same signal being applied to its other input via a filter similar to the filter circuit A as described with reference to FIG. 3. The difference signal of these two signals then exhibits a frequency response which is the inverse of that of the filter circuit A. (In a similar way each section of the filter circuit A may be replaced by a differential amplifier whose one branch includes a circuit of the same type as in FIG. 5).

Figure 6:
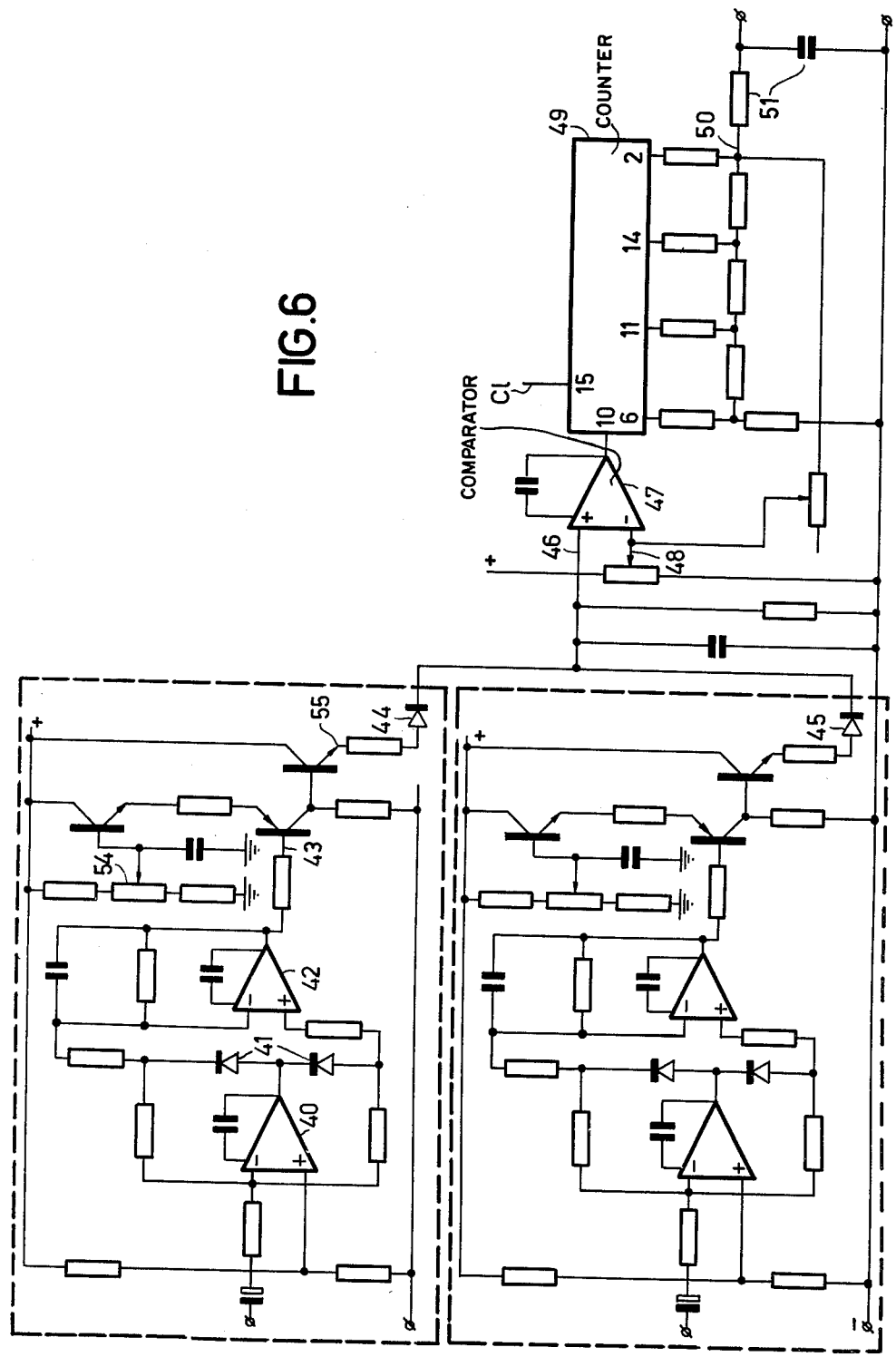
FIG. 6 shows one possible embodiment of a part of the channel for generating a control voltage.

As is shown in FIG. 6, the rectifier/threshold amplifier combinations 15, 17 and 16, 18 of FIG. 1 take the form of two identical circuits, each comprising an operational amplifier 40 (for example of the type TDA 1034 Philips), followed by a full-wave rectifier 41 and a second operational amplifier 42, for example of the same type. The rectified voltage thus obtained at point 43 should exceed the threshold voltage, which is adjustable with the resistor 54, in order to be capable of reaching the output 55.

The two identical circuits, one of which is connected to the filter 13, FIG. 1 and the other to the filter 14, are connected to an input 46 of an operational amplifier 47 via a circuit 19 in FIG. 1 (for example an analog AND-gate), comprising the rectifiers 44 and 45 respectively. The output voltage of a counter 49 is applied to the other input 48 of said operational amplifier 47. The greater of the signals applied to the rectifiers 44 and 45 will consequently reach the input 46 of the operational amplifier 47, which is connected as a comparator, and is compared with the voltage at the input 48. The comparator 47 and the counter 49 thus function as the memory circuit E of FIG. 1. The principal terminals are designated in accordance with the standard notation.

The output signal of the operational amplifier 47 supplies the count-up command to the counter 49 if the voltage at the input 46 is higher than that at the input 48 and the count-down command in the reverse case. The output voltage (at point 50) of the counter 49 is applied to the input 48 thus follows the voltage at the input 46, so that the counter 49 functions as a memory circuit for the voltage at the input 46. This output voltage is passed via an R-C network 51 before producing the control voltage at the conductor 21 in FIG. 1. This network ensures that the sound level produced by the reproduction channel does not decrease too suddenly in the case of a decreasing noise level, for the human ear also adapts itself to the reduced noise level after a certain time. In many practical cases only one filter A or C (FIGS. 3 and 5 respectively) suffices, which respectively attenuates and boosts a comparatively high frequency. Owing to the nature of the noise source it may be necessary to employ a second filter which is tuned to a comparatively low frequency. Experiments have revealed that low-frequency noise with frequencies below the 1000 Hz limit may have a masking effect in the frequency range above 1000 Hz and reduce the intelligibility in this range. By measuring the low-frequency noise below 1000 Hz and by adapting, i.e. increasing the level of the signal which passes through the reproduction channel to an increasing low-frequency noise for frequencies above 1000 Hz, the intelligibility of said signal can be maintained. It may also be desirable for a better sound reproduction in the high-frequency range above 1000 Hz to employ a plurality of such filters, which are alternately switched in accordance with some time schedule or other. In that case it suffices to employ a filter circuit A, which in addition to the one lower frequency (for example 250 Hz), alternately suppresses a higher frequency (for example 1600 Hz, 2500 Hz and 3150 Hz), the relevant filter element being alternately switched in by means of a sequential switch. The filter circuit C is then extended to a plurality of alternately switched-in sections 13, 14, which each boost the associated frequencies, rectify them and transfer them to the threshold devices, after which the circuit 19, which has also been adapted to this plurality of inputs which respond to each of these channels, only transmits that control voltage which comes through most strongly.

In practice the memory circuit E is only necessary if the control voltage is to be retained at a fixed value in accordance with the second method described in the foregoing. The simplest manner of realizing this is that the filter A in FIG. 1 is bridged by a manually or electronically actuated switch 60, which also switches on or off the clock voltage C1 to be applied to the counter 49. Before the instant that an input signal is applied to the terminal 1, this switch is depressed, i.e. the filter A is short-circuited and at the same time the clock voltage C1 is switched off, so that the control voltage which is produced is fixed at the value corresponding to said instant.

From the foregoing it will be evident that it is essential to obtain a control signal which is independent of the signal which passes through the sound reproduction channel. Experiments have revealed that in the case of non-ideal filters A and C it may be useful to provide means for adjusting the threshold voltages (variable resistor 54 in FIG. 6 and the corresponding variable resistor in the other circuit) to a value which is higher according as the signal through the reproduction channel 1-10 increases. In order to adapt these threshold voltages automatically to said signals through the reproduction channel, this signal may be detected with the aid of a detector 61, after which the direct voltage obtained is applied to the stages 17 and/or 18 as a threshold voltage. As an acoustic signal generally exhibits a certain reverberation time it is advisable to provide the detector 61 with an output filter 62 having an R-C time which is adapted to said reverberating time, so that the threshold voltage which is generated decays with an attenuation similar to that of the acoustic signal itself with its reverberation.

It is to be noted that the invention is by no means limited to the embodiment shown in FIG. 1, which arrangement comprises two branches. The invention is also applicable to arrangements provided with a branch 6 which does not or hardly affect the sound transmission and for example two branches 7, each comprising a network 4 having a transfer characteristic which falls towards the bass-tone frequency end, and a network 5 in the form of a dynamic range compressor. The frequency response curve of the network 4 in the second branch falls 6 dB per octave towards the low frequencies below approx. 1000 Hz, and is flat above 1000 Hz. This branch then serves to adapt the arrangement to noise in the form of speech, as stated previously. The network 4 of the first branch 7 then has a frequency response curve which falls towards the lower frequencies with approx. 6 dB per octave down from approx. 8 kHz, unity gain being obtained at approx. 1000 Hz. This first branch then serves to adapt the arrangement to noise with a flat spectrum, as stated in the foregoing.

The control device should then determine the type of noise in the space and accordingly adapt the combination ratio of the output signals of said channels. The nature of the noise can be determined by introducing two channels 13, 15, 17 into the control device, for sampling the noise at two frequencies in the frequency range above 1000 Hz, and by comparing the values thus obtained with each other.

What is claimed is:

1. An arrangement for sound reproduction in a space in which an independent sound source can also be present, said arrangement comprising; (1) a sound reproduction channel that comprises, an electro-acoustic transducer for converting electric signals in the reproduction channel into acoustic signals, an amplifier, at least two branches, one branch having a substantially flat frequency response characteristic over substantially the complete audio range, and at least one other branch having a transfer characteristic which falls towards the low frequency end of the audio spectrum and comprising a dynamic range compressor for compressing the dynamic range of electric signals in said other branch, means for applying the outputs of the branches to a device for converting output signals of these branches in a variable proportion into a single signal, means for applying said signal to said electroacoustic transducer, (2) a separate channel, including a sound transducer, for generating a control voltage which depends on the sound level of said independent sound source but which is independent to a substantial extent of any signal picked up by said sound transducer from the electroacoustic transducer, and (3) means for varying the gain and the frequency response of said amplifier in the sound reproduction channel by controlling said variable proportion by means of said control voltage.

2. An arrangement as claimed in claim 1 wherein the transfer characteristic of the other branch is chosen so that electric signals in said branch having frequencies in the treble range are pulled up to a level which corresponds to the level of the electric signals in said branch having frequencies in a frequency range lying between the treble and bass frequencies.

3. An arrangement as claimed in claims 1 or 2 wherein the sound reproduction channel includes a band rejection filter connected in cascade with at least one branch thereof, and the separate channel for the generation of the control voltage includes a band-pass filter and with both said filters tuned to the same frequency band.

4. An arrangement as claimed in claim 3, characterized in that said frequency band falls within a frequency range where the other branch of the sound reproduction channel exhibits a frequency response in which signal amplitude decreases as the frequency decreases.

Claim 5. An arrangement as claimed in claim 4 wherein the separate channel for generating the control voltage includes a threshold device responsive to a signal from the sound transducer, and means for controlling the magnitude of the threshold voltage of said threshold device as a function of a signal which passes through the sound reproduction channel.

Claim 6. An arrangement as claimed in Claim 3 wherein the separate channel for generating the control voltage includes a threshold device responsive to a signal from the sound transducer, and means for controlling the magnitude of the threshold voltage of said threshold device as a function of a signal which passes through the sound reproduction channel.

7. Apparatus for reproducing sound information present in an environment subject to a further independent source of sound comprising:

a second reproduction channel including input means for receiving a sound information signal, output means for supplying an output sound information signal to a load, an amplifier, a first signal processing circuit having a relatively flat frequency response characteristic in the frequency range of the sound information signal, a second signal processing circuit having a frequency response characteristic which attenuates the low frequency portion of the sound information frequency spectrum relative to the high frequency portion of said frequency spectrum and including dynamic range signal compressor means, means for adjusting the ratio of sound information signals supplied by said first and second signal processing circuits as a function of a control voltage, and means including said first and second signal processing circuits, said amplifier and said adjusting means for coupling the input means to the output means, means including a sound transducer for generating a control voltage which depends solely on the sound level of said independent sound source, and means coupling the control voltage to the sound ratio adjusting means.

8. An apparatus as claimed in claim 7 wherein said coupling means connects said first and second signal processing circuits in parallel with each other and in series with said amplifier between the input means and the output means, and wherein the second signal processing circuit includes a high-pass filter for attenuating signals in the bass frequency range.

9. An apparatus as claimed in claim 7 wherein said control voltage generating means includes a band rejection filter connected in the sound reproduction channel and a band-pass filter connected to said sound transducer, each of said filters being tuned to substantially the same frequency band.

10. An apparatus as claimed in claims 7 or 9 wherein said coupling means connects said first and second signal processing circuits in parallel with each other and in series with said amplifier between the input means and the output means.

11. An apparatus as claimed in claim 9 wherein the filters are tuned to a band of frequencies that correspond to the band of frequencies of the signals produced by the independent sound source.

12. An apparatus as claimed in claims 7, 8 or 9 wherein said control voltage generating means includes a threshold device coupled to said sound transducer, and means for deriving a threshold voltage therefor that is dependent upon a signal passing through the sound reproduction channel.

13. An apparatus as claimed in claims 7 or 8 wherein said control voltage generating means includes a memory device for storing the value of the control voltage.

* * * * *

UNITED STATES PATENT AND TRADEMARK OFFICE
CERTIFICATE OF CORRECTION

PATENT NO. : 4,322,579

DATED : March 30, 1982

INVENTOR(S) : DERK KLEIS ET AL

It is certified that error appears in the above—identified patent and that said Letters Patent is hereby corrected as shown below:

Column 7, line 58 after "48" insert --and--

Signed and Sealed this

Twenty-first Day of September 1982

[SEAL]

Attest:

GERALD J. MOSSINGHOFF

Attesting Officer     Commissioner of Patents and Trademarks